United States Patent [19]

Hirayama

[11] Patent Number: 5,612,643
[45] Date of Patent: Mar. 18, 1997

[54] SEMICONDUCTOR INTEGRATED CIRCUIT WHICH PREVENTS MALFUNCTIONS CAUSED BY NOISE

[75] Inventor: Takeshi Hirayama, Tokyo, Japan

[73] Assignee: NEC Corporation, Tokyo, Japan

[21] Appl. No.: 618,730

[22] Filed: Mar. 20, 1996

Related U.S. Application Data

[63] Continuation of Ser. No. 414,009, Mar. 30, 1995, abandoned.

[30] Foreign Application Priority Data

Mar. 30, 1994 [JP] Japan ......................... 6-61688

[51] Int. Cl.$^6$ ......................................... G05F 3/02
[52] U.S. Cl. ........................ 327/534; 327/537; 327/546
[58] Field of Search ............................... 327/50, 77, 78, 327/143, 198, 534, 545, 564

[56] References Cited

U.S. PATENT DOCUMENTS

| | | | |
|---|---|---|---|
| 4,223,238 | 9/1980 | Parkinson et al. | 327/536 |
| 4,233,672 | 11/1980 | Suzuki et al. | 365/181 |
| 4,571,505 | 2/1986 | Eaton, Jr. | 327/536 |
| 4,622,480 | 11/1986 | Uchimura et al. | 327/337 |
| 4,825,275 | 4/1989 | Tomassetti | 327/534 |
| 4,893,029 | 1/1990 | Matsuo et al. | 327/543 |
| 5,041,894 | 8/1991 | Reczek et al. | 327/198 |
| 5,119,337 | 6/1992 | Shimizu et al. | 365/201 |
| 5,164,613 | 11/1992 | Mumper et al. | 327/143 |
| 5,293,055 | 3/1994 | Hara et al. | 257/296 |

FOREIGN PATENT DOCUMENTS

| | | |
|---|---|---|
| 1206438 | 8/1989 | Japan . |
| 4367945 | 12/1992 | Japan . |

*Primary Examiner*—Terry Cunningham
*Attorney, Agent, or Firm*—Sughrue, Mion, Zinn, Macpeak & Seas

[57] ABSTRACT

In a semiconductor integrated circuit device, a MOS transistor has a relatively high built-in threshold, and in operation, a substrate bias is applied to the MOS transistor so as to cause the MOS transistor to forcibly have a reduced threshold, so that the MOS transistor operates at a high speed with the reduced threshold. When noise is detected, application of the substrate bias is stopped so that the MOS transistor restores the relatively high built-in threshold, and simultaneously, the MOS transistor is put in a standby condition, so that a malfunction can be prevented with the relatively high built-in threshold.

10 Claims, 16 Drawing Sheets

SEMICONDUCTOR INTEGRATED CIRCUIT WHICH PREVENTS MALFUNCTIONS CAUSED BY NOISE

This is a continuation of application Ser. No. 08/414,009 filed Mar. 30, 1995, now abandoned.

BACKGROUND OF THE INVENTION

1. Field of the Invention

The present invention relates to a semiconductor integrated circuit, and more specifically to a semiconductor integrated circuit having a function of preventing a malfunction caused by noise.

2. Description of Related Art

In general, high speed operation and a high integration of a semiconductor integrated circuit are being advanced with demands for a high speed operation and a high integration of a system because of advanced information processing technology.

Recently, semiconductor integrated circuit have been used in a variety of devices, apparatuses, and machine because of advanced information processing technology. For example, semiconductor integrated circuits are now widely used not only in in-house machines such as rice cookers and electric washing machines, but also in large machines encountered in daily life such as automobiles, signals, and crossing gates. At present, the semiconductor integrated circuits themselves are deeply integrated into daily activity and have become non-detectable to a human being.

The reason that the semiconductor integrated circuits are widely utilized in human activity is that machines and apparatuses incorporating the semiconductor integrated circuits, typified by a microcomputer in most cases, have intelligence, so that a comfortable environment is realized by the intelligent machines and apparatuses.

On the other hand, because the semiconductor integrated circuit is incorporated in a machine, accidents have happened. For example, it was reported that an accident resulting in injury or death occurred because a semiconductor integrated circuit constituting a program controlled device for automatic speed control in an automobile having an automatic transmission caused a program runaway for an unknown reason. This is an example indicating that the semiconductor integrated circuits deeply integrated in human activity must have high reliability and high operational accuracy.

In most cases, however, environments in which the semiconductor integrated circuits are actually used in various machines have large temperature changes, moisture changes, and are filled with electrical noise and mechanical vibration. These conditions make it difficult to achieve high reliability and high operation accuracy. In addition, these are common operating environments of the semiconductor integrated circuits used for engine control in automobile and aircraft.

Therefore, in attempts to design a semiconductor integrated circuit to be used in a very severe environment as mentioned above, the circuit is designed with high reliability and high operational accuracy of the circuit as top priorities. As a result, a high speed operation of the circuit is sacrificed.

Since the conventional semiconductor integrated circuits are exposed to electrical noises as mentioned above, Japanese Patent Application Laid-open Publication No. JP-A-367945, for example, proposed a circuit to detect a noise in a signal line so as to put a microprocessor into a standby condition when the noise is detected and to maintain the microprocessor into the standby condition until the noise is not detected in order to ensure that the microprocessor does not mistake the noise for a signal. In addition, Japanese Patent Application Laid-open Publication No. JP-A-1-20438 proposed to trigger a system setting when a noise is detected which cannot be sufficiently attenuated by a noise attenuation circuit in a program controlled apparatus in order to avoid a program runaway.

These conventional semiconductor integrated circuits have been manufactured with a MOS transistor gate length on the order of 1 µm and a MOS transistor threshold on the order of 0.7 V (in N-channel MOS transistor). Accordingly, the above mentioned methods are effective in semiconductor integrated circuits which cause a simple control program to run with a clock on the order of 10 MHz.

However, semiconductor integrated circuits generally used in control systems are not only required to have high reliability and a highly accurate operation, but are now required to meet requirements for high speed operation and complicated operation. This demand for high speed operation and complicated operation is now increasing rapidly.

As a result, semiconductor integrated circuits incorporated in control systems can no longer be accepted if they cannot realize the high speed operation and the complicated operation similar to semiconductor integrated circuits used in information processing system such as EWS, and apparatuses incorporating a semiconductor integrated circuit.

Under this background, an effort for increasing the operational speed of semiconductor integrated circuits incorporated in general control systems has been advanced in a manner similar to that made in the semiconductor integrated circuits used in information processing systems. Namely, in accordance with a scaling rule in a design standard of the semiconductor process, efforts have been made to microminiaturize the semiconductor integrated circuits and to lower the supply voltage and the threshold of transistors and also lower the temperature of operating environment.

For example, the gate length of N-channel MOS transistors has been shorted to 0.35 µm from 1 µm in the prior art, and the supply voltage has been lowered from 5 V to 3 V. In addition, the threshold of MOS transistors has been lowered from 0.7 V to 0.4 V. With these improvements, the semiconductor integrated circuits have been constituted of N-channel MOS transistors intended for high speed operation.

However, it has been known that the above mentioned high speed N-channel MOS transistors has poor resistance to noise on a ground (GND) line and a supply voltage (VDD) line and to a rapid change in the supply voltage in comparison with the prior art MOS transistors, and therefore, the transistors are easily broken. This is because the supply voltage and the transistor threshold have been lowered, but the noise on the GND line and the VDD line and the rapid change in the supply voltage are essentially unchanged. As a result, the noise and the rapid change of the supply voltage having a conventional magnitude becomes large in comparison with the reduced supply voltage and the reduced threshold. Thus, a state held by a semiconductor integrated circuit constituted of the high speed MOS transistors is easily flipped by noises that had not posed a problem in the prior art semiconductor integrated circuit.

Because of this, a malfunction of a semiconductor integrated circuit constituted of the high speed MOS transistors cannot be completely prevented by a malfunction preventing circuit disclosed in Japanese Patent Application Laid-open Publication No. JP-A-4-367945 which is configured to maintain a microprocessor into a standby condition when there is a possibility of a malfunction until the possibility of the malfunctional disappears. In this connection, it may be considered to apply a substrate bias in the standby condition to evaluate the threshold voltage of the MOS transistors included in the semiconductor integrated circuit for the purpose of preventing the malfunction. However, since a substrate biasing circuit ceaselessly consumes electric power in the standby period, the power consumption in the standby condition becomes large in comparison with the conventional semiconductor integrated circuit.

Examine a system proposed by Japanese Patent Application Laid-open Publication No. JP-A-1-20438 to trigger a system setting for preventing the malfunction of the semiconductor integrated circuit. A program for controlling the semiconductor integrated circuit becomes complicated year after year, and therefore, the number of program steps from the system reset until the system start also increases. Accordingly, the method of No. JP-A-1-20438 becomes difficult to apply except in limited applications.

As mentioned above, in the semiconductor integrated circuits required to have high reliability and a high accurate operation, the malfunction caused by the GND noise and VDD noise generated by the semiconductor integrated circuits themselves or by external disturbance has become a large problem.

In particular, in the case that the semiconductor integrated circuits are constituted of MOS transistors having a reduced threshold for meeting the demands of the device size reduction and the supply voltage reduction so as to realize a high speed operation and a high integration degree, the malfunction occurrence percentage in logic gate circuits and other circuits constituted of low threshold MOS transistors, caused by the GGND noise, the VDD noise and the rapid variation in the supply voltage, is higher than the malfunction percentage in logic gate circuits and other circuits constituted of conventional high threshold MOS transistors. The malfunction rate is higher regardless of whether a circuit system is static or dynamic.

As a result, even if a static circuit is put into a standby condition for suppress malfunction which might be caused by the GND noise, the VDD noise and the rapid variation in the supply voltage, since a noise level similar to the conventional circuit is relatively large in comparison with the reduced threshold of the low threshold transistor, the circuit's state holding capability is weakened. Accordingly, the state before the circuit is put into the standby condition cannot be held by only the movement to the standby condition. As a result, a malfunction occurs when the circuit is returned from the standby condition.

SUMMARY OF THE INVENTION

Accordingly, it is an object of the present invention to provide a semiconductor integrated circuit which overcomes the above mentioned deficiencies of the conventional circuits.

Another object of the present invention is to provide a semiconductor integrated circuit capable of preventing a malfunction caused by noise such as the GND noise, the VDD noise and the rapid variation in the supply voltage.

The above and other objects of the present invention are achieved in accordance with the present invention by a semiconductor integrated circuit device having a function of preventing malfunction caused by noise, comprising at least one MOS transistor having a relatively high built-in threshold, a substrate biasing means for applying a predetermined substrate bias to the MOS transistor in operation so that the MOS transistor has a reduced threshold lower than the built-in threshold, whereby the MOS transistor can operate at a high speed, a noise detecting means for generating a noise detection signal when noise exceeding a predetermined level occurs, and a control means responding to the noise detection signal to put the semiconductor integrated circuit device into a standby condition and to cause the substrate biasing means to stop application of the predetermined substrate bias to the MOS transistor so that the MOS transistor restores the built-in threshold in the standby condition.

In one embodiment, the MOS transistor is of an N-channel type and the substrate biasing means applies a predetermined positive substrate bias to the N-channel MOS transistor.

In another embodiment, the semiconductor integrated circuit device is of a CMOS type including at least one N-channel MOS transistor form in a P-well and at least one P-channel MOS transistor formed in a N-well, and the substrate biasing means applies a first predetermined voltage to the P-well so as to positively bias to the P-well and a second predetermined voltage to the N-well so as to negatively bias to the N-well.

The above and other objects, features and advantages to the present invention will be apparent from the following description of preferred embodiments of the invention with reference to the accompanying drawings.

DESCRIPTION OF THE PREFERRED EMBODIMENTS

Figure 1:
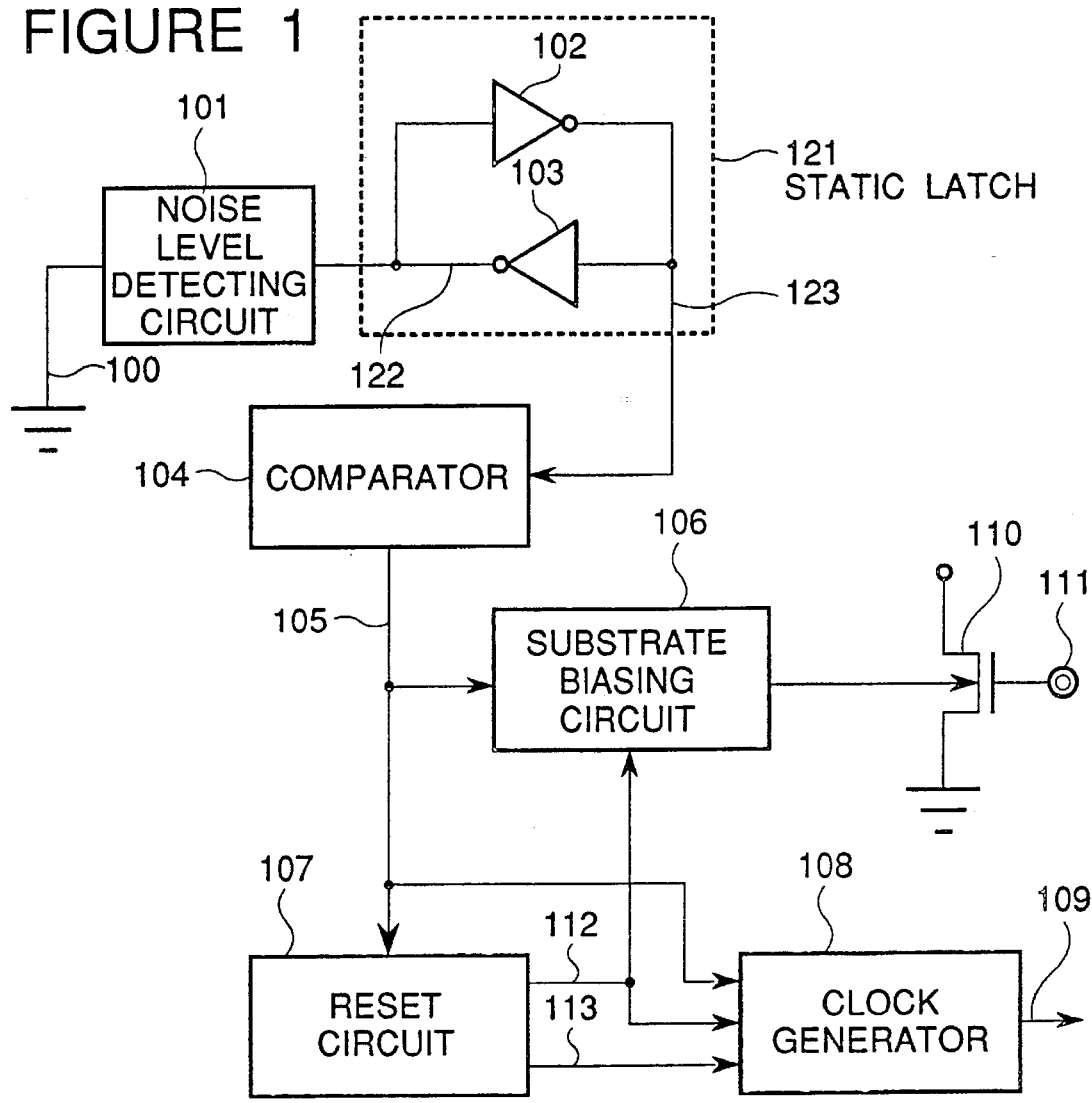
FIG. 1 is a block diagram of a first embodiment of the semiconductor integrated circuit device in accordance with the present invention.

Referring to FIG. 1, a first embodiment of the semiconductor integrated circuit device in accordance with the present invention includes an N-channel MOS transistor 110 formed in a P-type semiconductor substrate. This N-channel MOS transistor 110 should be understood to represent a large number of N-channel MOS transistors constituting a semiconductor integrated circuit device. The N-channel MOS transistor 110 is manufactured to have a threshold voltage Vt of 0.7 V. The shown semiconductor integrated circuit device also includes a substrate biasing circuit 106 for reducing the threshold voltage Vt to 0.4 V when the semiconductor integrated circuit device is put in an operation condition. In this manner, high speed operation can be achieved. In addition, the shown semiconductor integrated circuit device also includes a noise level detecting circuit 101 for detecting, for example, a ground noise (GND noise) when a noise having a level greater than a predetermined level (for example 0.7 V) occurs on a ground line 100.

In order to prevent a malfunction of the first embodiment of the semiconductor integrated circuit device caused by a chattering signal generated by a high frequency noise which would be generated by an overshooting of the operation in an input/output buffer, for example, this noise level detecting circuit 101 may include a low pass filter having a cutoff frequency of 80 MHz, which is the same as that of a system clock. The detector may also include a discriminating circuit including a resistor type voltage divider used for comparing a noise level with a reference voltage Vref of 0.7 V, a flipflop and a comparator, which are connected in sequence. These elements are not shown in the drawing.

Furthermore, the shown semiconductor integrated circuit device includes a static latch 121 comprising an inverter 102 having a large driving power and having an input connected to an output signal 122 of the noise level detecting circuit 101 and another inverter 103 having a small driving power and an input connected to an output of the inverter 102 and an output connected to the input of the inverter 102. With this arrangement, when the output signal of the noise level detecting circuit 101 is brought to a high level indicative of generation of a noise, it is held in the static latch 121, and this condition is maintained until the output signal of the noise level detecting circuit 101 is brought to a low level indicating that the noise disappears or becomes negligible. Therefore, the static latch 121 notifies that significant noise is being generated. An output 123 of the static latch 121 is connected to a comparator 104.

Figure 9:
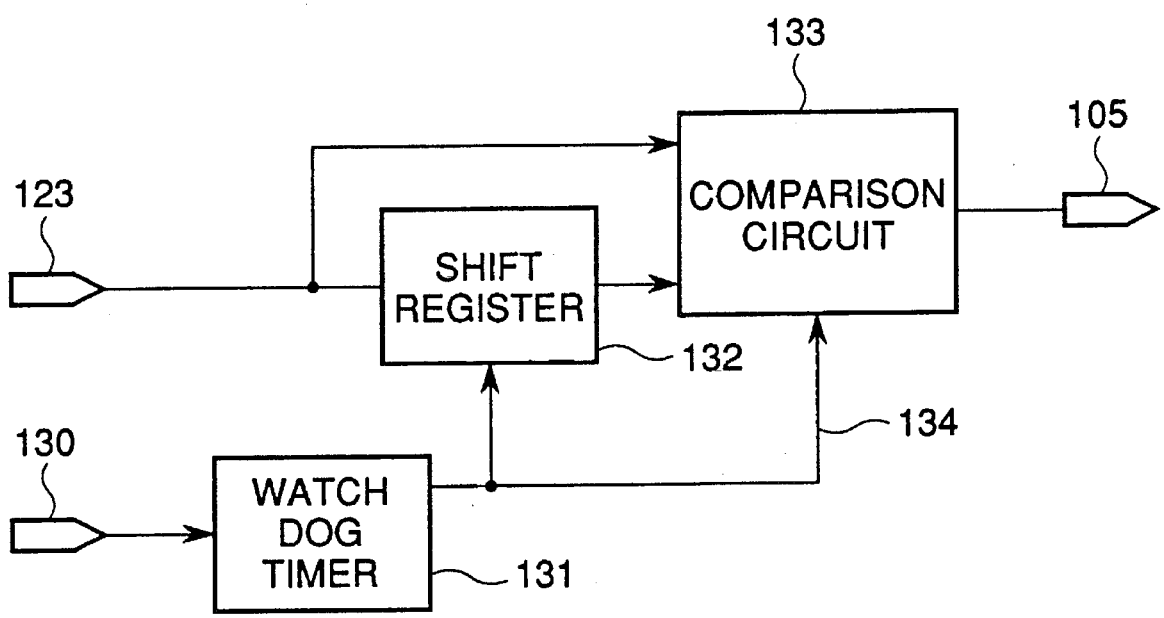
FIG. 9 is a block diagram of the comparator incorporated in the semiconductor integrated circuit device of the first embodiment.

Referring to FIG. 9, the comparator 104 includes a shift register 132 for receiving and holding the output 123 of the static latch 121, a watch dog timer 131 for driving this register 132, and a comparison circuit 133 triggered by an output 134 of the watch dog timer 131, for comparing the current output 123 of the static latch 121 with the output 123 of the static latch 121 before two clocks, stored in the shift register 132.

When the result of comparison indicates inconsistency, if the output 123 of the static latch 121 indicates generation of a noise, the comparator 104 outputs a high level signal from its output 105. This high level signal 105 of the comparator is maintained until the content of the static latch changes.

The first embodiment of the semiconductor integrated circuit device also includes a reset circuit 107 responding to a rising edge of the output signal 105 of the comparator 104 for returning from a standby condition to an operating condition, and a clock generator 108 responding to a rising of a reset signal 113 generated by the reset circuit 107, so as to cause an internal oscillating circuit 151 (shown in FIG. 12) to start its oscillation. This clock generator 108 responds to a rising edge of the output signal 105 of the comparator 104, so as to stop its control clock output 109 at a first falling of the clock 109 after the rising edge of the output signal 105. Namely, the semiconductor integrated circuit is put into the standby condition.

With the above mentioned arrangement, when a ground noise occurs on the ground line 100, the semiconductor integrated circuit is caused to stop its operation and is brought into the standby condition. At the same time, the substrate biasing circuit 106 responds to the rising edge of the output signal 105 so as to return the threshold Vt of the N-channel MOS transistor 110 to 0.7 V determined by the manufacturing process. If the noise disappears, the substrate biasing circuit 106 changes the threshold Vt of the N-channel MOS transistor 110 to 0.4 V, and the semiconductor integrated circuit is returned to the operation condition from the standby condition.

The semiconductor integrated circuit is so configured that, in order to realize a high speed operation in the normal operating condition, the substrate potential is controlled by the substrate biasing circuit 106 so that the threshold Vt of the N-channel MOS transistor 110 is changed from 0.7 V determined by the manufacturing process to another threshold of 0.4 V which is desired in the operating condition. In combination with a 0.35 μm gate length MOS structure, this feature realizes a high speed operation.

Figure 2:
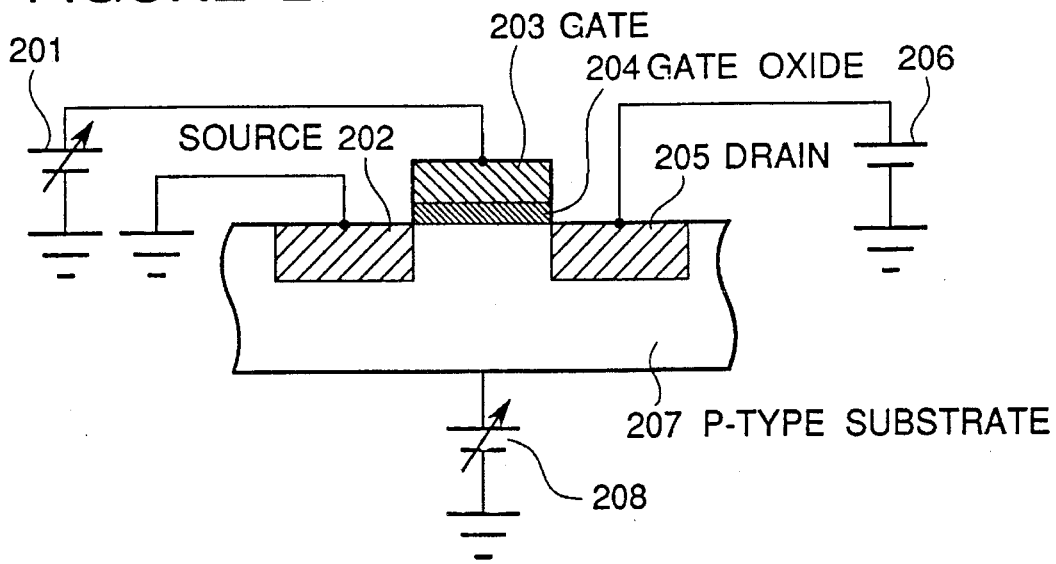
FIG. 2 is a diagrammatic sectional view of the semiconductor integrated circuit device of the first embodiment shown in FIG. 1.
Figure 4:
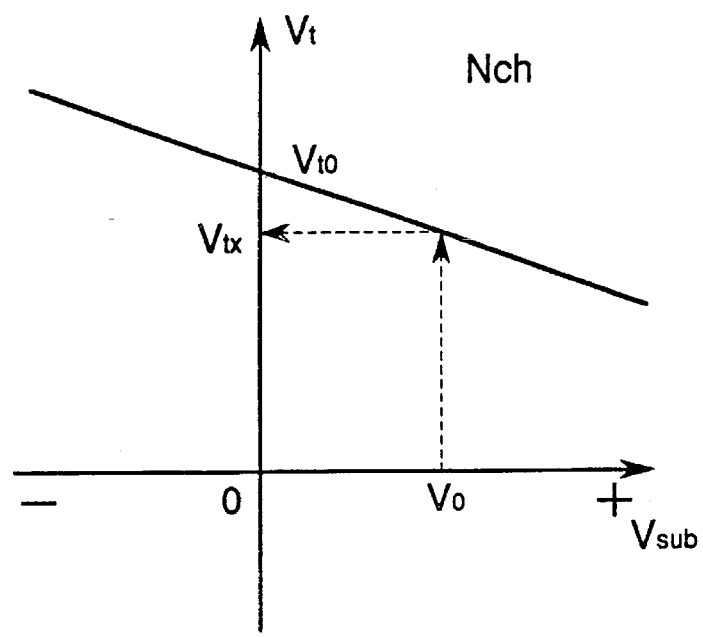
FIG. 4 is a graph illustrating the characteristics of the substrate voltage (Vsub) to the threshold (Vt) in an N-channel MOS transistor.

Referring to FIGS. 2 and 4, the substrate biasing circuit 106 corresponds to a substrate biasing variable voltage supply 208 shown in FIG. 2. If a P-type semiconductor substrate 207 is biased to be positive in comparison with a potential (ground) of an $N^+$ diffusion region (source) 202, the threshold Vt of the N-channel MOS transistor 110 lowers in accordance with a characteristics curve of the threshold Vt to the substrate potential Vsub of the N-channel MOS transistor 110 as shown in FIG. 4.

Figure 10:
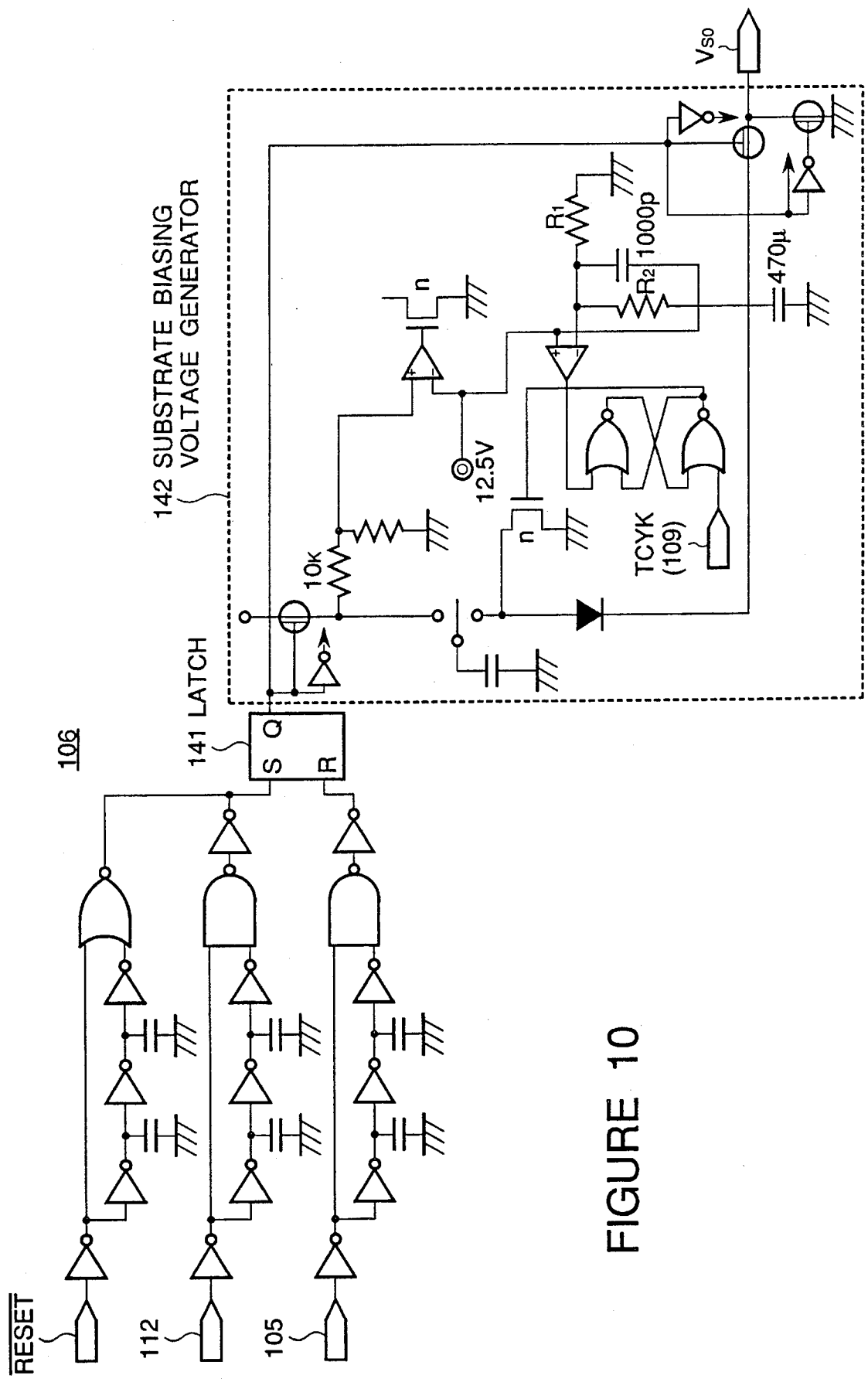
FIG. 10 is a detailed circuit diagram of the substrate biasing circuit incorporated in the semiconductor integrated circuit device of the first embodiment.
Figure 11:
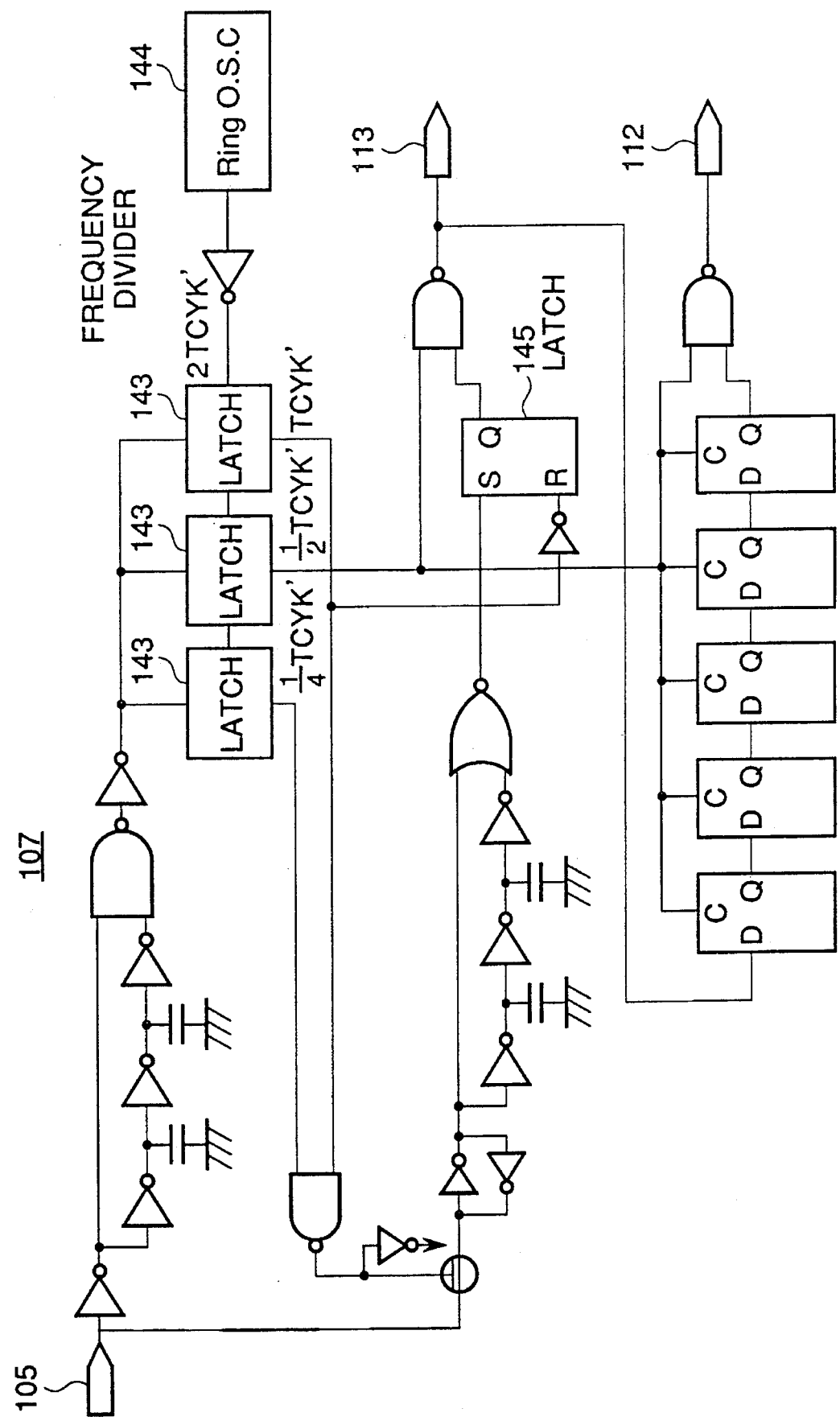
FIG. 11 is a detailed circuit diagram of the substrate biasing circuit incorporated in the semiconductor integrated circuit device of the first embodiment.
Figure 12:
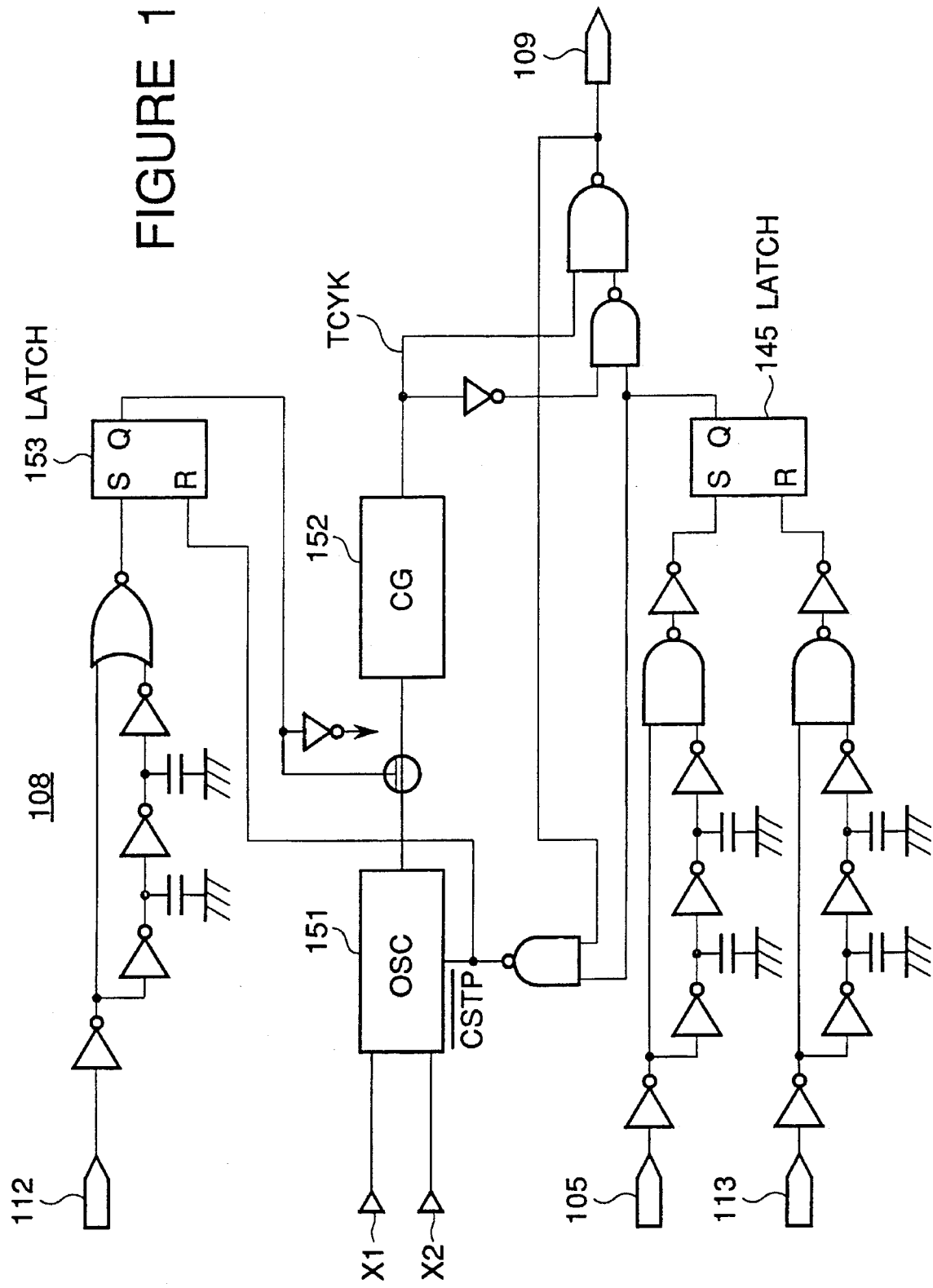
FIG. 12 is a detailed circuit diagram of the clock generator incorporated in the semiconductor integrated circuit device of the first embodiment.

Respective detailed circuit structures of the substrate biasing circuit 106, the resetting circuit 107 and the clock generator 108 are shown in FIGS. 10, 11 and 12. However, since the substrate biasing circuit 106, the resetting circuit 107 and the clock generator 108 can be constructed from well known circuits by a person skilled in the art, a detailed explanation is omitted.

As mentioned above, since the N-channel MOS transistor 110 can have a desired threshold Vt, the semiconductor integrated circuit composed of the N-channel MOS transistors 110 can realize a high speed operation.

Here, the threshold Vt of the N-channel MOS transistors 110 can be set by the substrate biasing potential, but the threshold Vt of the N-channel MOS transistors 110 is required to be within a range capable of ensuring a proper operation of the semiconductor integrated circuit.

Figure 5:
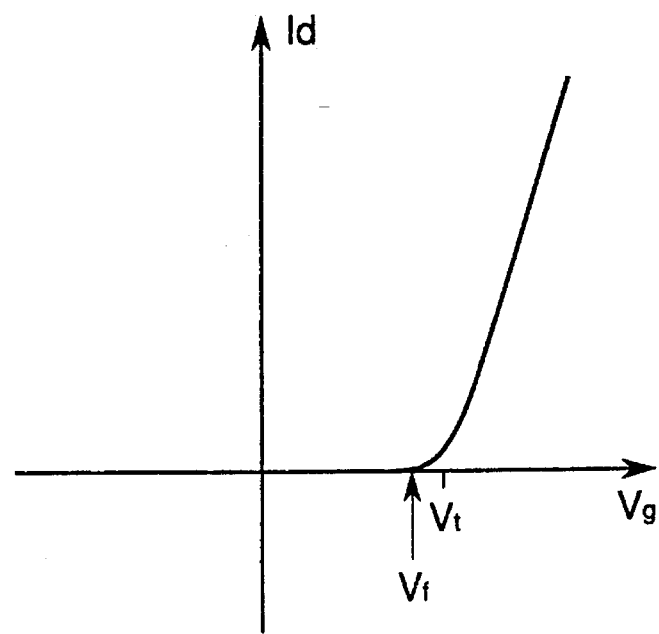
FIG. 5 is a graph illustrating the characteristics of the gate voltage (Vg) to the drain current (Id) in a N-channel MOS transistor.

As shown in FIG. 5, the relation of the drain current Id to the gate voltage Vg in an enhancement N-channel MOS transistor is such that the threshold Vt of the N-channel MOS transistor is higher than a built-in voltage Vf between the P-type semiconductor substrate 207 and the $N^+$ diffusion region (source) 202. If the threshold Vt is in this range, the ON/OFF of the MOS transistor can be controlled by a gate voltage Vg. Accordingly, the substrate bias potential is set to ensure that the substrate potential Vsub is lower than the built-in voltage Vf.

Now, operation of the first embodiment when the noise is detected, will be explained.

Figure 3:
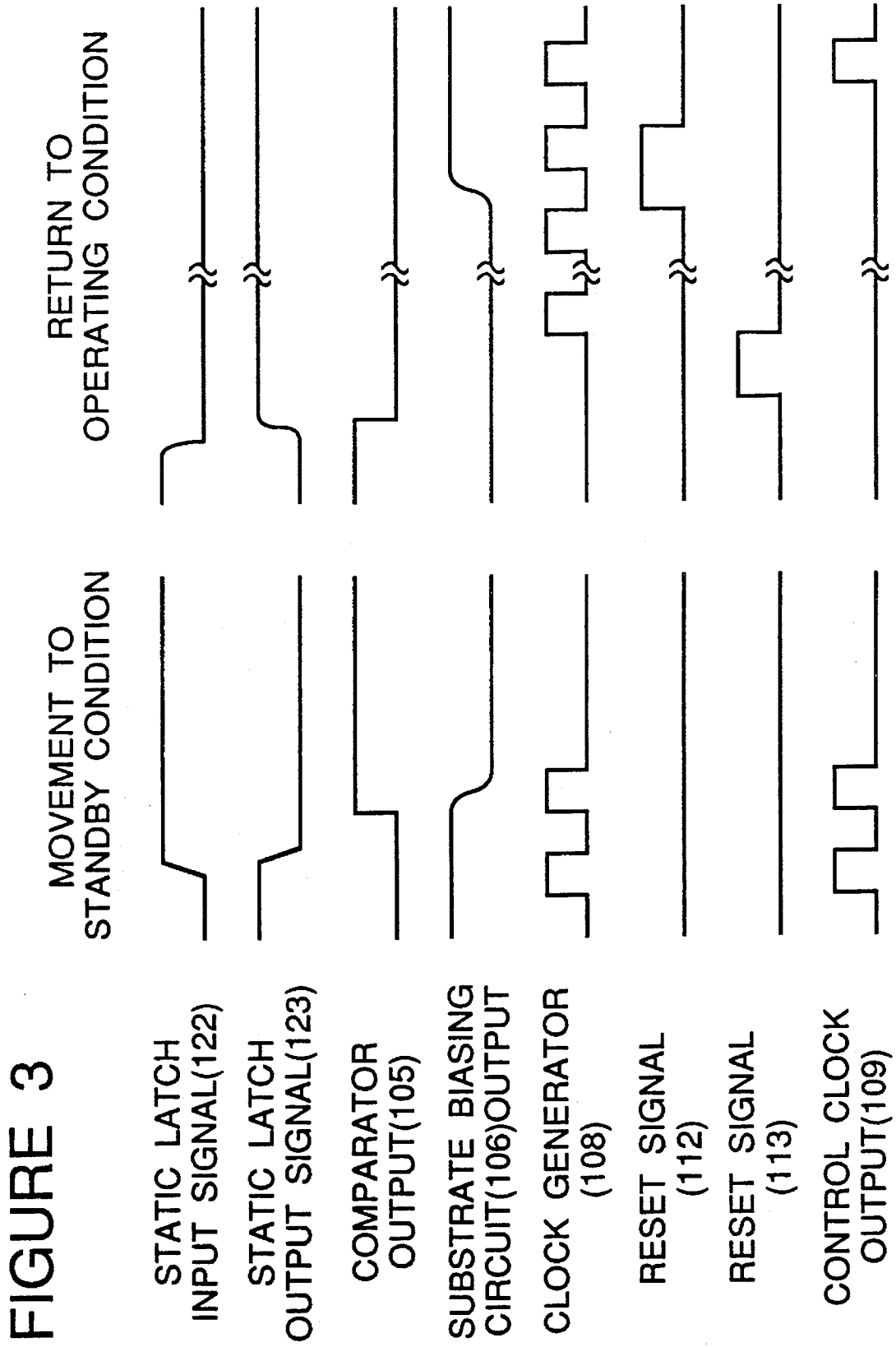
FIG. 3 is a timing chart illustrating an operation of the semiconductor integrated circuit device of the first embodiment shown in FIG. 1.

Referring to FIG. 3 illustrating various input and output waveforms and internal conditions in the first embodiment, in operation, noise caused by an external disturbance appearing on the ground line 100 or noise caused by all-bit simultaneous operation of input/output buffers, is filtered in the noise level detecting circuit 101 for eliminating unnecessary high frequency components, and the noise level (or noise strength) is discriminated.

When the noise level detecting circuit 101 outputs a high level signal 122 indicative of generation of the noise, this is held in the static latch 121 until the output signal 122 of the noise level detecting circuit 101 is brought to a low level.

The output 123 of the static latch 121 is supplied to the comparator 104, where the shift register 132 stores the output 123 of the static latch 121, and the output 123 of the static latch 121 is compared with the output 123 of the static latch 121 before two clocks stored in the shift register 132 by the comparison circuit 133.

If the result of the comparison in the comparison circuit 133 is inconsistency and if the output 123 of the static latch 121 indicates the generation of a noise, the comparator 104 outputs the high level output signal 105.

In response to a rising edge of the output signal 105 of the comparator 104, the substrate biasing circuit 106 stops application of a positive substrate bias voltage to the N-channel MOS transistor 110. The substrate bias voltage lowers within a half period of a system clock and becomes stable.

At the same time, namely, in response to a rising edge of the output signal 105 of the comparator 104, the clock generator 108 stops its controlling clock output 109 at a first falling of the controlling clock with the highest priority. Thereafter, the clock generator 108 stops oscillation of the internal clock oscillator. The internal clock oscillator in the clock generator 108 is formed of large-size transistors, and therefore, has the possibility of giving large influence on the level of the ground line. The internal clock oscillator is stopped before the rising of the oscillation waveform, so that the internal condition is maintained at a standby condition.

As a result of the stop of the clock generation, the semiconductor integrated circuit of the first embodiment is put in the standby condition to avoid the malfunction which would otherwise be caused by the noise. This first embodiment is constructed of a completely static circuit having no dynamic signal path, the circuit operation is stopped by stopping the controlling clock. Accordingly, the semiconductor integrated circuit of the first embodiment is put in the standby condition without requiring additional processing for entering the standby condition other than stopping the supplying of the controlling clock.

In the standby condition, the threshold Vt of the N-channel MOS transistors 110 realizing the high speed operation with a lowered threshold is returned to 0.7 V built in threshold, since application of the substrate bias is stopped. Accordingly, a standby condition having the ground noise resistance property similar to that of a semiconductor integrated circuit device formed of well-known N-channel MOS transistors widely used at present. Therefore, the break of register contents and flipflop contents caused by the ground noise, which becomes a problem in N-channel MOS transistors having a low built-in threshold for the high speed operation, can be effectively prevented.

The good state holding characteristics in the standby condition is realized, not by an external voltage supply, but by the built-in voltage set in accordance with the manufacturing process. Therefore, the power consumption in the standby condition can be greatly reduced. In particular, since application of the substrate bias is stopped in the standby condition, contrary to the conventional method, the power consumption can be reduced by one half or more.

Next, returning to the operating condition from the standby condition will be described.

Referring to FIGS. 1, 11 and 12, in response to the falling of the comparator output 105, a watch dog timer internally provided in the reset circuit 107 is reset to start its counting operation. The reset circuit 107 samples the comparator output 105 at four system clocks. If the reset circuit 107 detects that the comparator output 105 is brought to the low level, the reset circuit 107 brings the reset signal 113 to the high level. The high level period of the reset signal 113 is controlled by the watch dog timer internally provided in the reset circuit 107 so as to correspond to one period of a system clock TCYK.

In response to the rising of the reset signal 113, the clock generator 108 causes the internal oscillator 151 to start is oscillation operation.

By further utilizing the watch dog timer internally provided in the reset circuit 107, the reset circuit 107 brings the reset signal 112 to a high level delayed from the rising of the reset signal 113 by a delay corresponding to ten period of the system clock TCYK. The high level period of the reset signal 112 corresponds to one period of the system clock TCYK.

In response to the rising edge of the reset signal 112, the substrate biasing circuit 106 starts to apply the positive substrate bias to the N-channel MOS transistor 110. The positive substrate bias becomes stable alter a half period of the system clock TCYK. Furthermore, in response to the falling of the reset signal 113, the clock generator 108 starts to output the controlling clock 109 from the rising of the clock first outputted from the internal oscillator 151 in the clock generator 108. With this, the semiconductor integrated circuit device of the first embodiment is returned to the operating condition from the standby condition with no possibility of malfunction caused by the ground noise.

Assuming that the number of malfunctions caused by the ground noise is 100, malfunctions caused by primary noises generated on the ground line number 50, and malfunctions triggered by a counteraction of the noise caused by a parasitic capacitance and similar phenomena number 30. The remaining 20 malfunctions is sorted to be due to a cause which becomes a problem in a low threshold MOS transistor. Specifically, these 20 cases can be exemplified by malfunctions caused by leakage or inversion of data held in MOS transistors which will occur even if the circuit is put into the standby condition.

Therefore, the semiconductor integrated circuit device of the first embodiment can prevent the malfunctions directly caused by the ground noise. In addition, the semiconductor integrated circuit device of the first embodiment could prevent 85% of malfunctions other than the malfunctions directly caused by the ground noise. The remaining 15% of malfunctions include for example a malfunction caused by a counteraction of the ground noise generated during a short time before the semiconductor integrated circuit device of the first embodiment is put in the standby condition.

As seen from the above, the semiconductor integrated circuit device of the first embodiment is so configured that, in the operating condition, the threshold of the N-channel MOS transistor is controlled by the substrate biasing circuit, so that the circuit operates at a high speed with a reduced threshold of the N-channel MOS transistor. When a ground noise is detected, the application of the substrate bias is stopped so that the threshold of the N-channel MOS transistor is returned to a high built-in threshold determined in accordance with the manufacturing process, and at the same time, the circuit is put in the standby condition so as to hold the state of the circuit. Therefore, since the N-channel MOS transistor assumes the high built-in threshold determined in accordance with the manufacturing process, the N-channel MOS transistor is hardly subjected to the ground noise. In addition, a special voltage supply for holding the state of the circuit in the standby condition is not required, and the electric power consumption in the standby condition does not occur other than a minute leak current. Accordingly, the power consumption in the standby condition can be reduced to 50% or less of that required in the conventional semiconductor integrated circuit device.

In the above mentioned embodiment, the semiconductor integrated circuit device formed of N-channel MOS transistors has been explained. It would be apparent to persons skilled in the art that a similar advantage can be obtained in a semiconductor integrated circuit device form of P-channel MOS transistors.

Figure 6:
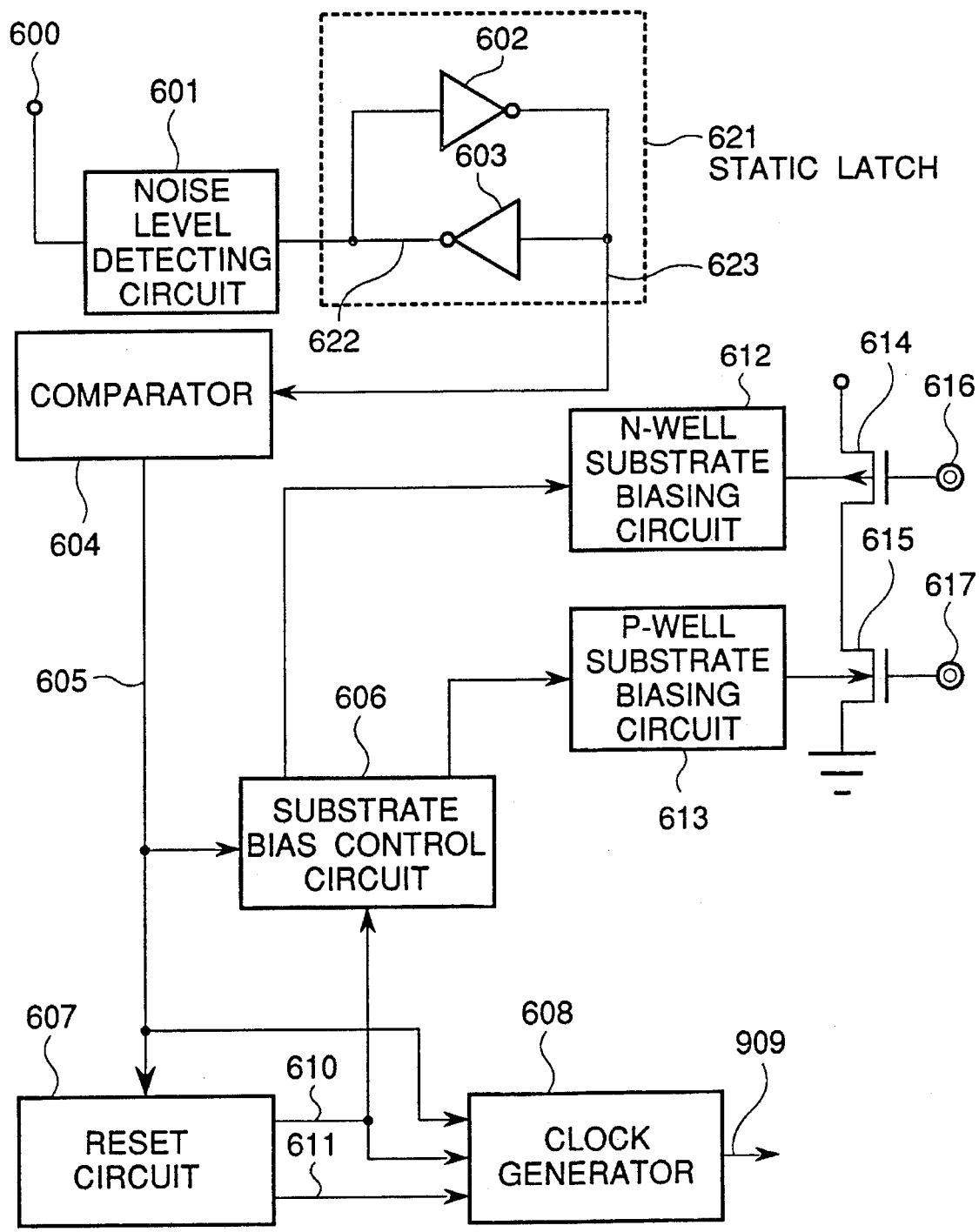
FIG. 6 is a block diagram of a second embodiment of the semiconductor integrated circuit device in accordance with the present invention.
Figure 7:
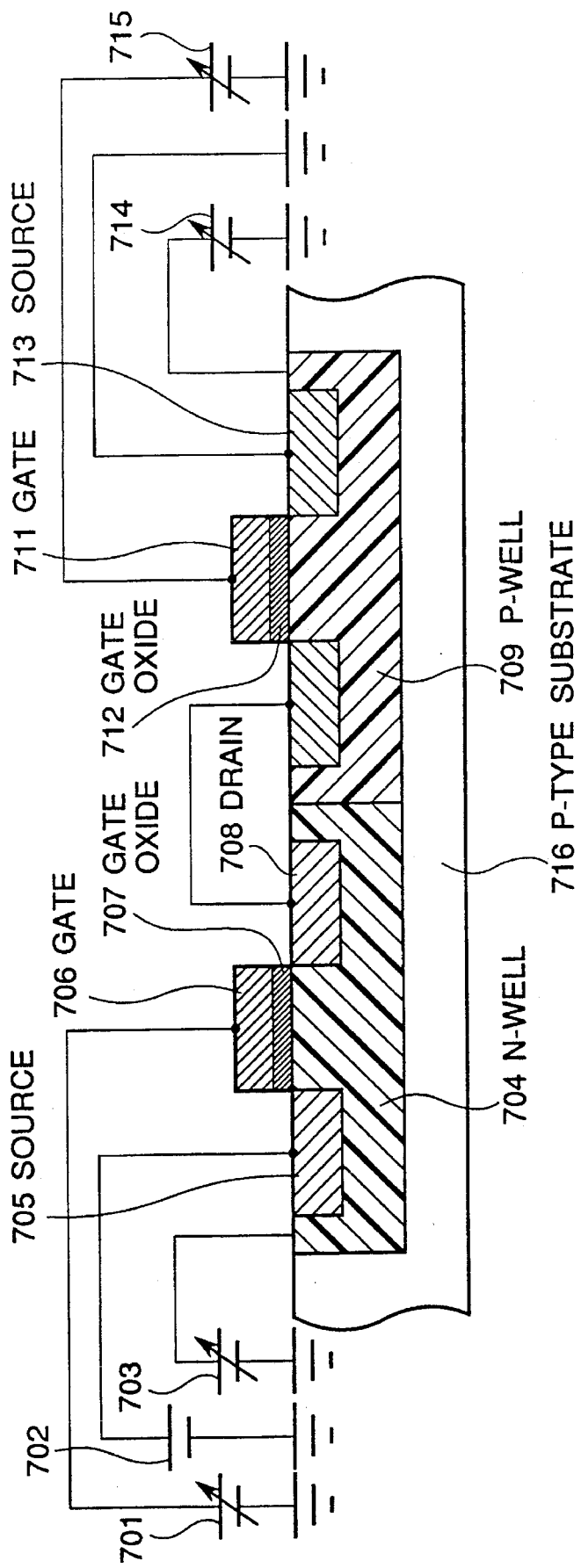
FIG. 7 is a diagrammatic sectional view of the semiconductor integrated circuit device of the second embodiment shown in FIG. 6.

Referring to FIGS. 6 and 7, a second embodiment of the semiconductor integrated circuit device in accordance with the present invention includes an N-channel MOS transistor 615 formed in a P-well 709 formed in a P-type semiconductor substrate 716 having a twin-well CMOS structure and a P-channel MOS transistor 614 formed in an N-well 706 formed in the P-type semiconductor substrate 716. The N-channel MOS transistor 615 and the P-channel MOS transistor 614 should be understood to represent a large number of N-channel MOS transistors and a large number of P-channel MOS transistors which constitute a CMOS semiconductor integrated circuit device. The N-channel MOS transistor 615 is manufactured to have a threshold voltage Vtn of +0.7 V, and the P-channel MOS transistor 614 is manufactured to have a threshold voltage Vtp of −0.7 V.

The shown semiconductor integrated circuit device also includes a substrate bias control circuit 606, a P-well substrate biasing circuit 613, controlled by the substrate bias control circuit 606, for causing the threshold voltage Vtn of the N-channel MOS transistor 615 to 0.4 V when the semiconductor integrated circuit device is put in an operating condition, and an N-well substrate biasing circuit 612, controlled by the substrate bias control circuit 606, for causing the threshold voltage Vt of the P-channel MOS transistor 615 to −0.4 V when the semiconductor integrated circuit device is put in an operating condition. With this arrangement, a high speed operation can be achieved.

In addition, the shown semiconductor integrated circuit device also includes a noise level detecting circuit 601 for detecting that a noise (VDD noise) occurs on a supply voltage line 600 and/or that an abrupt level variation occurs on the voltage supply voltage.

Similar to the first embodiment, in order to prevent a malfunction of the second embodiment of the semiconductor integrated circuit device caused by a chattering signal generated by a high frequency noise which would be generated by an overshooting of the operation in an input/output buffer, for example, this noise level detecting circuit 601 may include a low pass filter having a cutoff frequency of 100 MHz, which is the same as that of a system clock. The detector may also include a discriminating circuit including a resistor type voltage divider used for comparing a noise level with a reference voltage Vref of 0.7 V, a flipflop and a sequential comparator, which are connected in sequence. These elements are not shown in the drawing.

Furthermore, the shown second embodiment of the semiconductor integrated circuit device includes a static latch 621 comprising an inverter 602 having a large driving power and having an input connected to an output signal 622 of the noise level detecting circuit 601 and another inverter 603 having a small driving power and an input connected to an output of the inverter 602 and an output connected to the input of the inverter 602. With this arrangement, when the output signal of the noise level detecting circuit 601 is brought to a high level indicative of generation of a noise, it is held in the static latch 621. This condition is maintained until the output signal of the noise level detecting circuit 601 is brought to a low level indicating that the noise disappears or becomes negligible. Therefore, the static latch 621 notifies that a significant noise is being generated. An output 623 of the static latch 621 is connected to a comparator 604.

Figure 13:
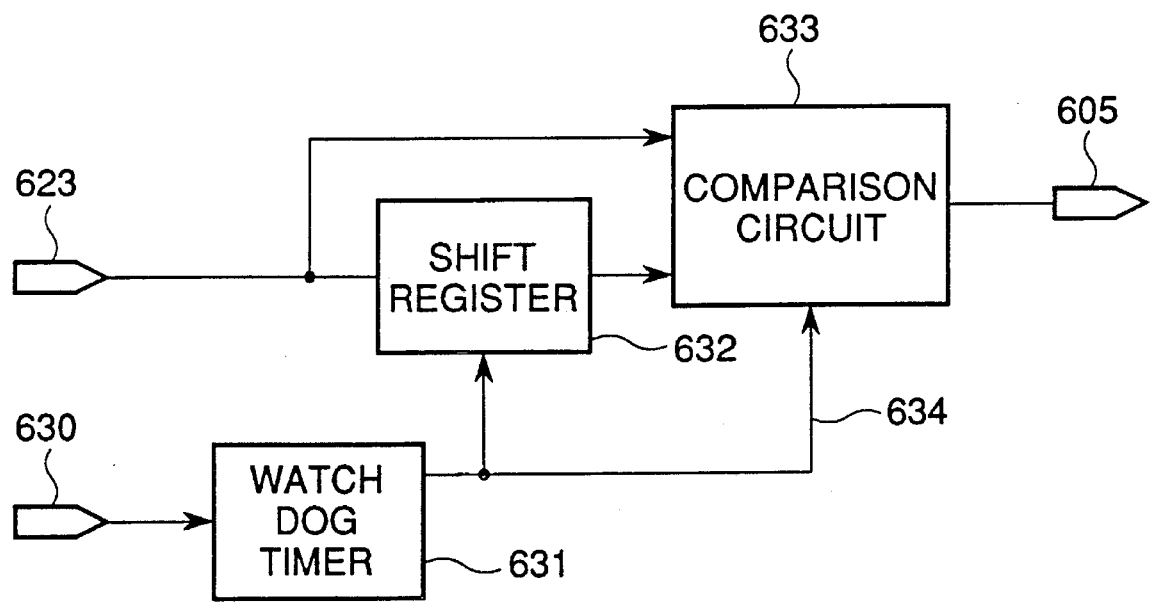
FIG. 13 is a block diagram of the comparator incorporated in the semiconductor integrated circuit device of the second embodiment.
Figure 14:
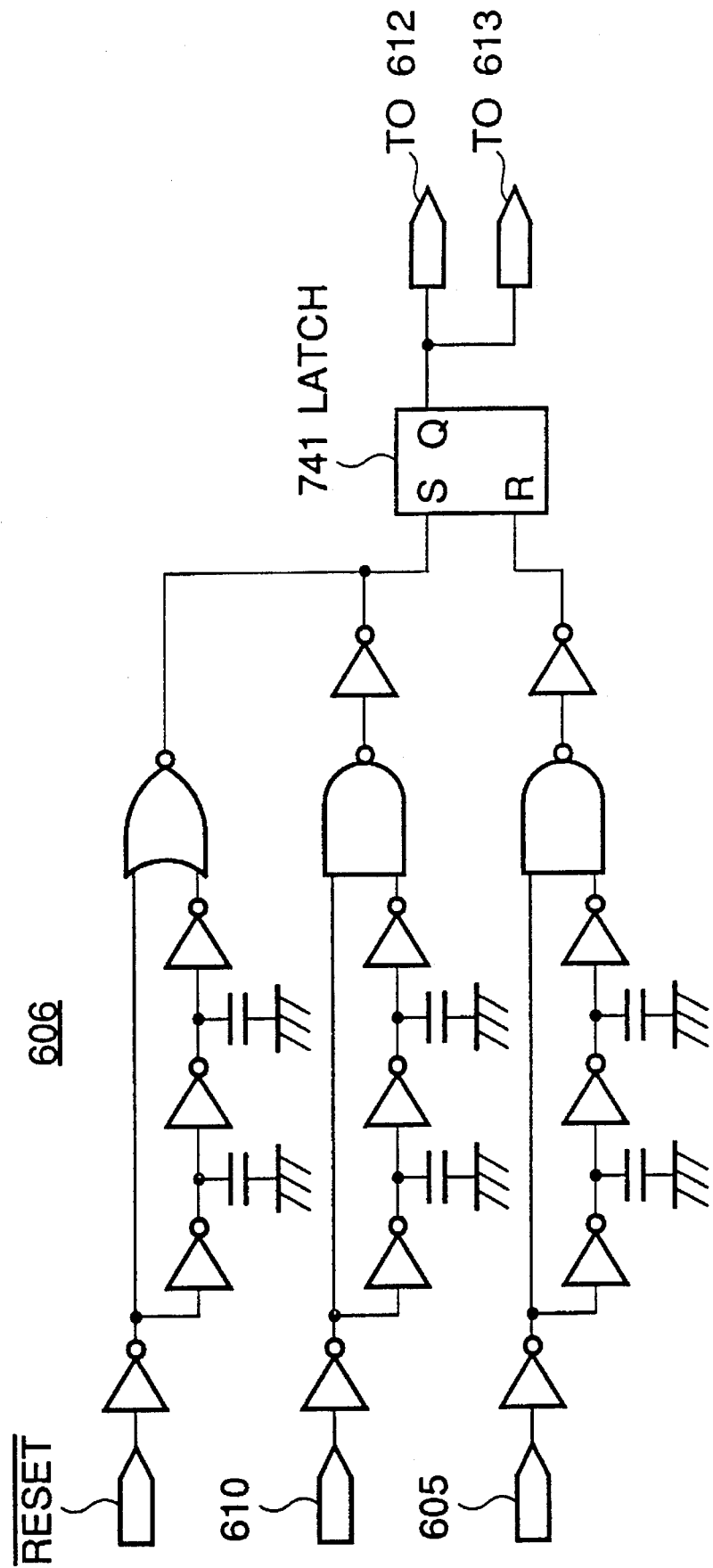
FIG. 14 is a detailed circuit diagram of the substrate biasing circuit incorporated in the semiconductor integrated circuit device of the second embodiment.
Figure 15:
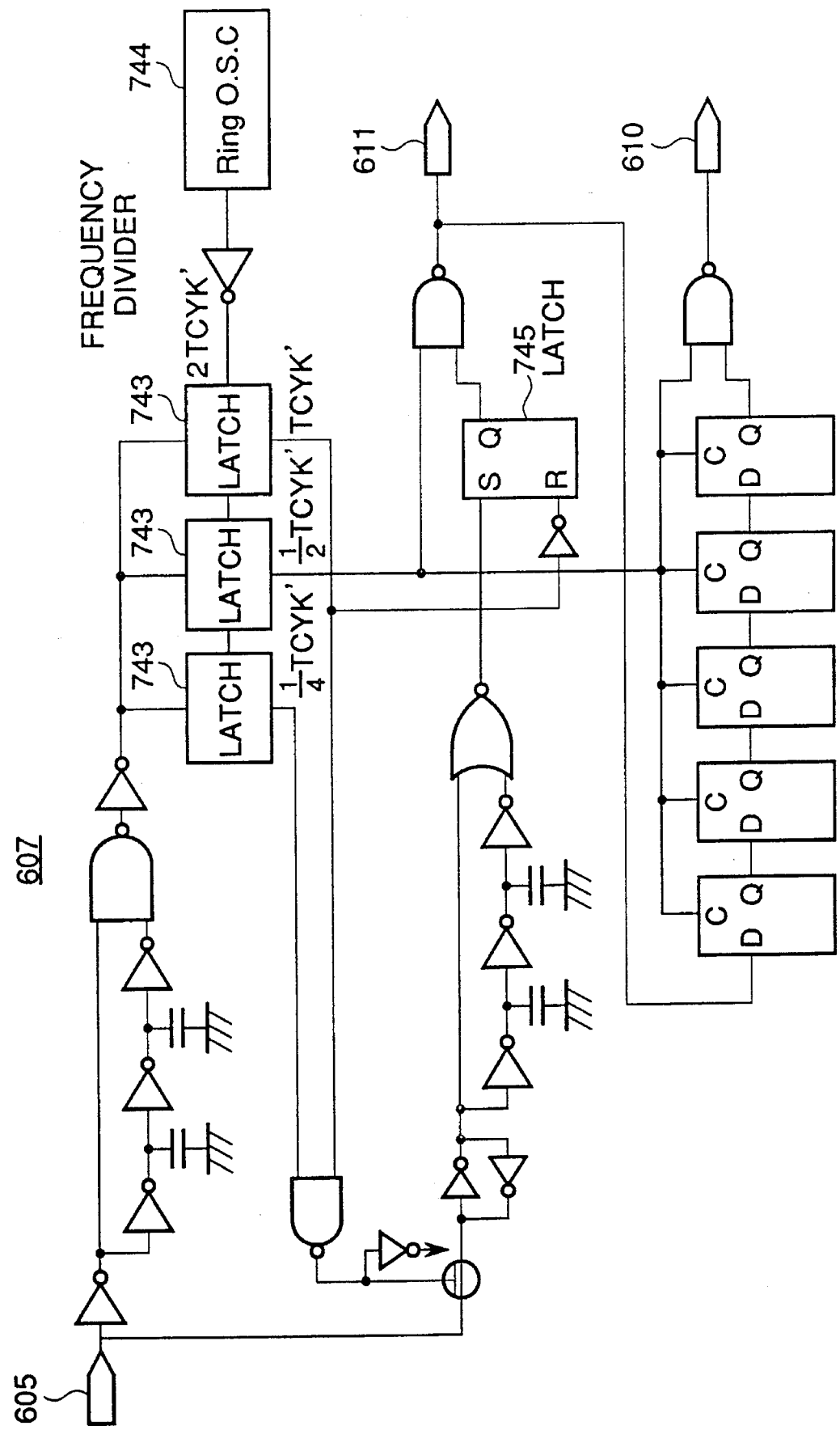
FIG. 15 is a detailed circuit diagram of the resetting circuit incorporated in the semiconductor integrated circuit device of the second embodiment.

Referring to FIG. 13, the comparator 604 includes a shift register 632 for receiving and holding the output 623 of the static latch 621, a watch dog timer 631 for driving this register 632, and a comparison circuit 633 triggered by an output 134 of the watch dog timer 631 for comparing the current output 623 of the static latch 621 with the output 623 of the static latch 621 before two clocks stored in the shift register 632.

When the result of the comparison indicates inconsistency and if the output 623 of the static latch 621 is indicative of generation of a noise, the comparator 604 outputs a high level signal from its output 605. This high level signal 605 of the comparator is maintained until the content of the static latch changes.

Figure 16:
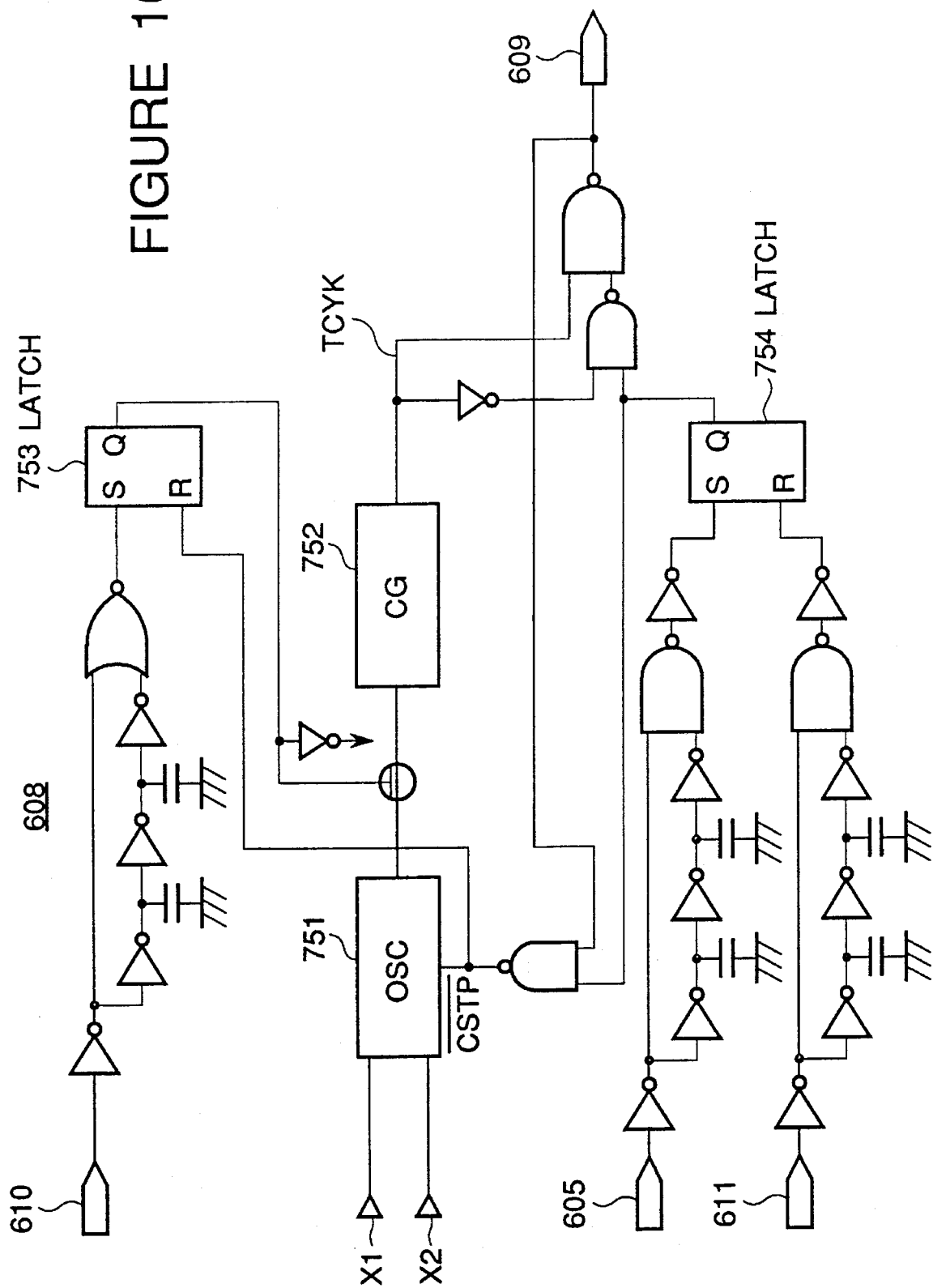
FIG. 16 is a detailed circuit diagram of the clock generator incorporated in the semiconductor integrated circuit device of the second embodiment.
Figure 17:
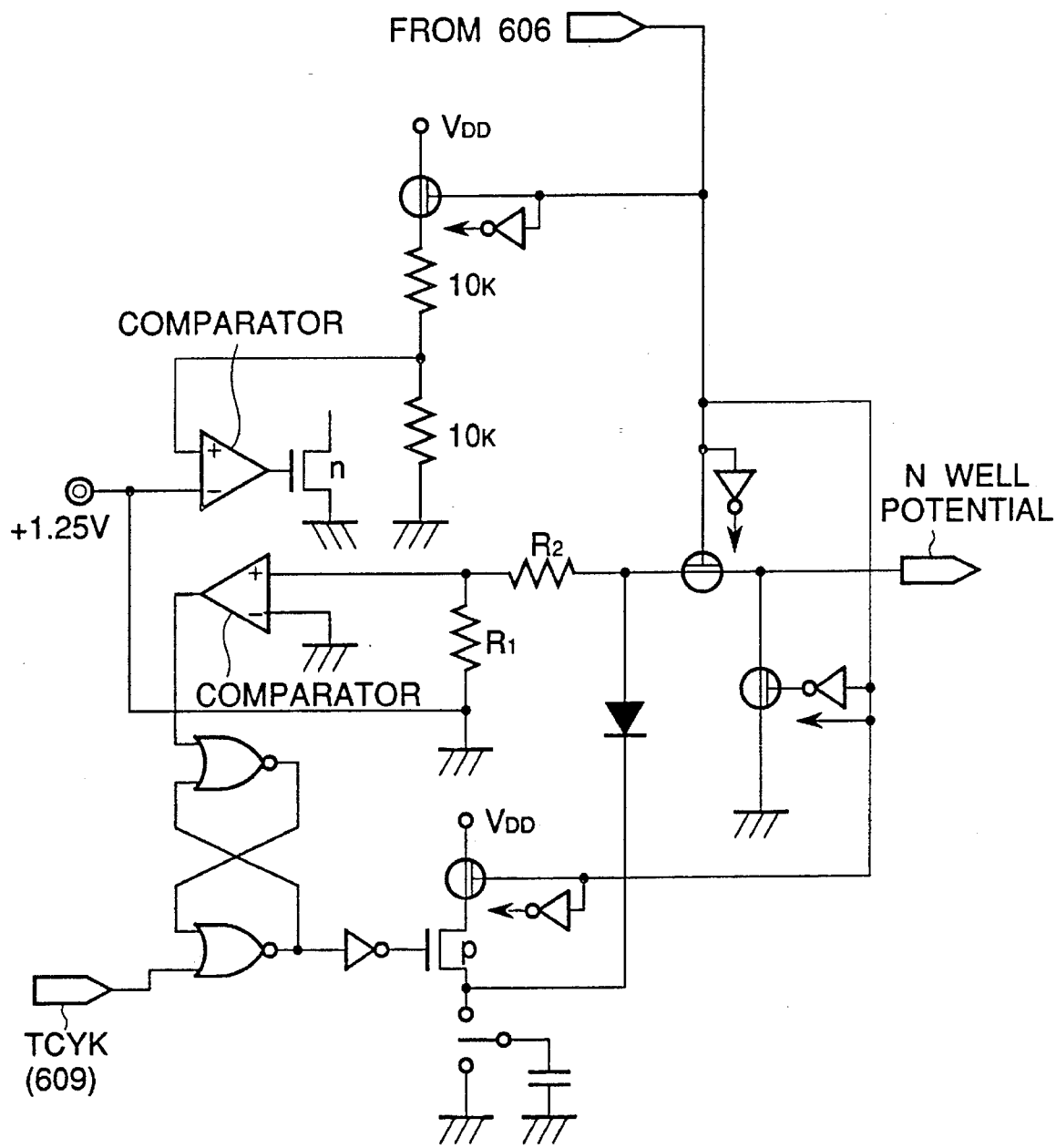
FIG. 17 is a detailed circuit diagram of the N-well substrate biasing circuit incorporated in the semiconductor integrated circuit device of the second embodiment.
Figure 18:
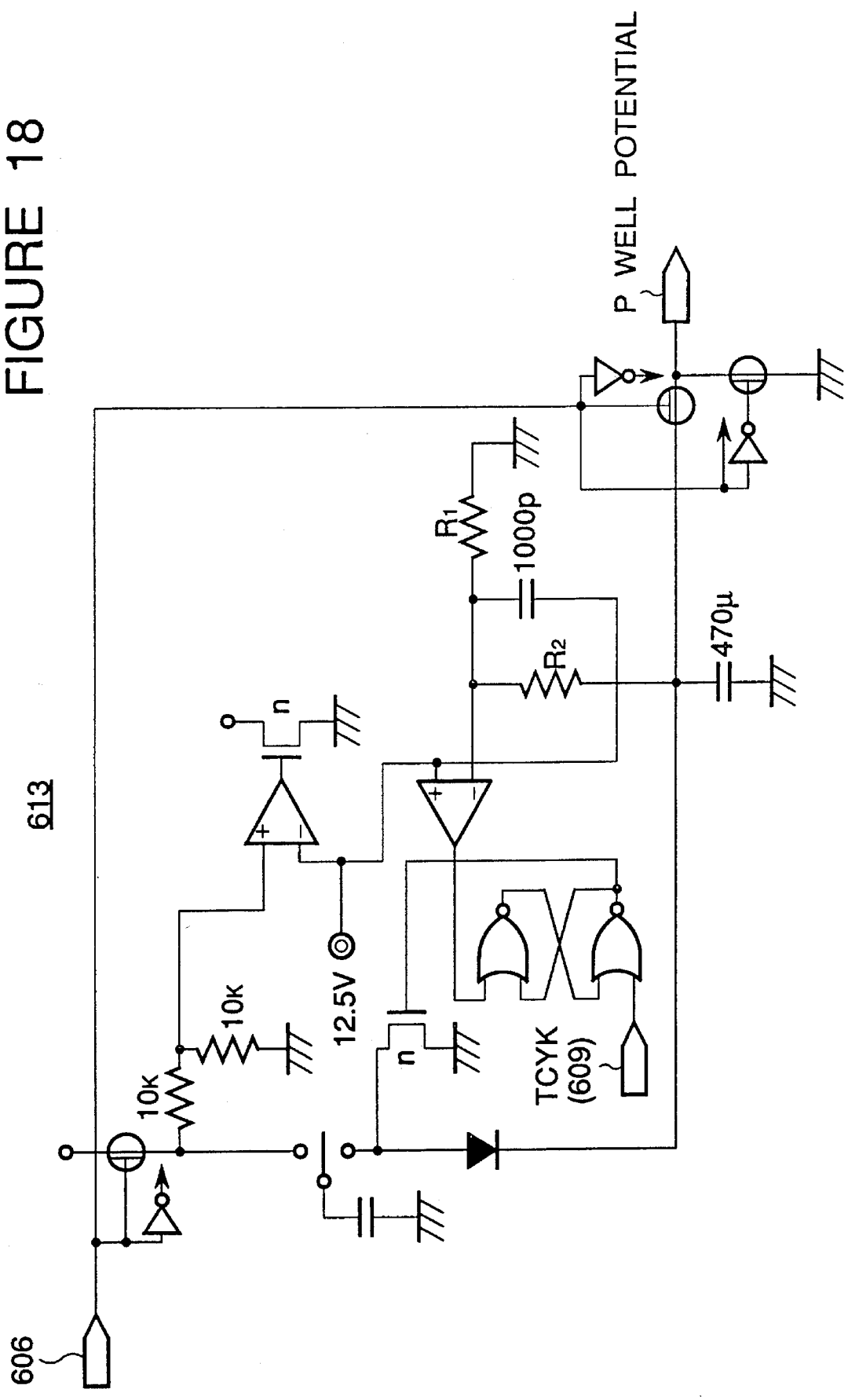
FIG. 18 is a detailed circuit diagram of the P-well substrate biasing circuit incorporated in the semiconductor integrated circuit device of the second embodiment.

The second embodiment of the semiconductor integrated circuit device also includes a reset circuit 607 responding to a rising edge of the output signal 605 of the comparator 604 for returning from a standby condition to an operating condition. The circuit also includes a clock generator 608 responding to a rising of a reset signal 611 generated by the reset circuit 607, so as to cause an internal oscillating circuit 751 (shown in FIG. 16) to start its oscillation. This clock generator 608 responds to a rising edge of the output signal 605 of the comparator 604, so as to stop its control clock output 609 at a first falling of the clock 609 after the rising edge of the output signal 605. Namely, the semiconductor integrated circuit is put into the standby condition.

Similar to the first embodiment, detailed circuit structures of the substrate bias control circuit 606, the resetting circuit 607, the clock generator 608, the N-well substrate biasing circuit 12 and the P-well substrate biasing circuit 613 are shown in FIGS. 14, 15, 16, 17 and 18. However, since these circuits can be constructed from well known circuits by a person skilled in the art, a detailed explanation is omitted.

With the above mentioned arrangement, when a noise exceeding a predetermined level occurs on the VDD line 600, or when an abrupt level variation occurs in the voltage supply voltage, the semiconductor integrated circuit is caused to stop its operation and is brought into the standby condition. At the same time, the P-well substrate biasing circuit 613 returns the threshold Vtn of the N-channel MOS transistor 615 to a built-in threshold of 0.7 V determined by the manufacturing process, and the N-well substrate biasing circuit 612 returns the threshold Vtp of the P-channel MOS transistor 614 to a built-in threshold of −0.7 V determined by the manufacturing process.

If the noise or the supply voltage variation disappears, the P-well substrate biasing circuit 613 changes the threshold Vtn of the N-channel MOS transistor 615 to 0.4 V, and the N-well substrate biasing circuit 612 changes the threshold Vtp of the P-channel MOS transistor 614 to −0.4 V. In addition, the semiconductor integrated circuit is automatically returned to the operating condition from the standby condition.

The semiconductor integrated circuit of the second embodiment is so configured that, in order to realize a high speed operation in the normal operating condition, the N-well in which the P-channel MOS transistor 614 is formed and the P-well in which the N-channel MOS transistor 615 is formed, are controlled by the N-well substrate biasing circuit 612 and the P-well substrate biasing circuit 613 both controlled by the substrate bias control circuit 606 in connection with a bias potential and an application timing of the bias potential. As a result, the threshold Vtn of the N-channel MOS transistor 615 is changed from the built-in threshold of 0.7 V determined by the manufacturing process to another threshold of 0.4 V which is desired in the operating condition, and the threshold Vtp of the P-channel MOS transistor 614 is changed from the built-in threshold of −0.7 V determined by the manufacturing process to another threshold of −0.4 V which is desired in the operating condition. In combination with a 0.35 μm gate length MOS structure, this feature realizes a high speed operation.

Referring to FIGS. 6 and 7, the N-well substrate biasing circuit 612 corresponds to an N-well substrate biasing variable voltage supply 703 shown in FIG. 7, which biases the N-well 704 formed in the P-type semiconductor substrate 716 to a potential negative to the potential of the P$^+$ diffusion layer (source) 705. The P-well substrate biasing circuit 613 corresponds to a P-well substrate biasing variable voltage supply 714 shown in FIG. 7, which biases the P-well 709 formed in the P-type semiconductor substrate 716 to a potential positive to the potential of the N$^+$ diffusion layer (source) 713. Thus, the threshold of the N-channel MOS transistor 615 is set to a desired low threshold (+0.4 V) from the built-in threshold (+0.7 V) determined in accordance with the manufacturing process, and the threshold of the P-channel MOS transistor 614 is set to a desired low threshold (−0.4 V) from the built-in threshold (−0.7 V) determined in accordance with the manufacturing process. As a result, the CMOS semiconductor integrated circuit composed of the N-channel MOS transistors 615 and the P-channel MOS transistor 614 can realize a high speed operation.

Now, operation of the second embodiment when the VDD noise is detected or when the abrupt supply voltage variation is detected, will be explained.

Figure 8:
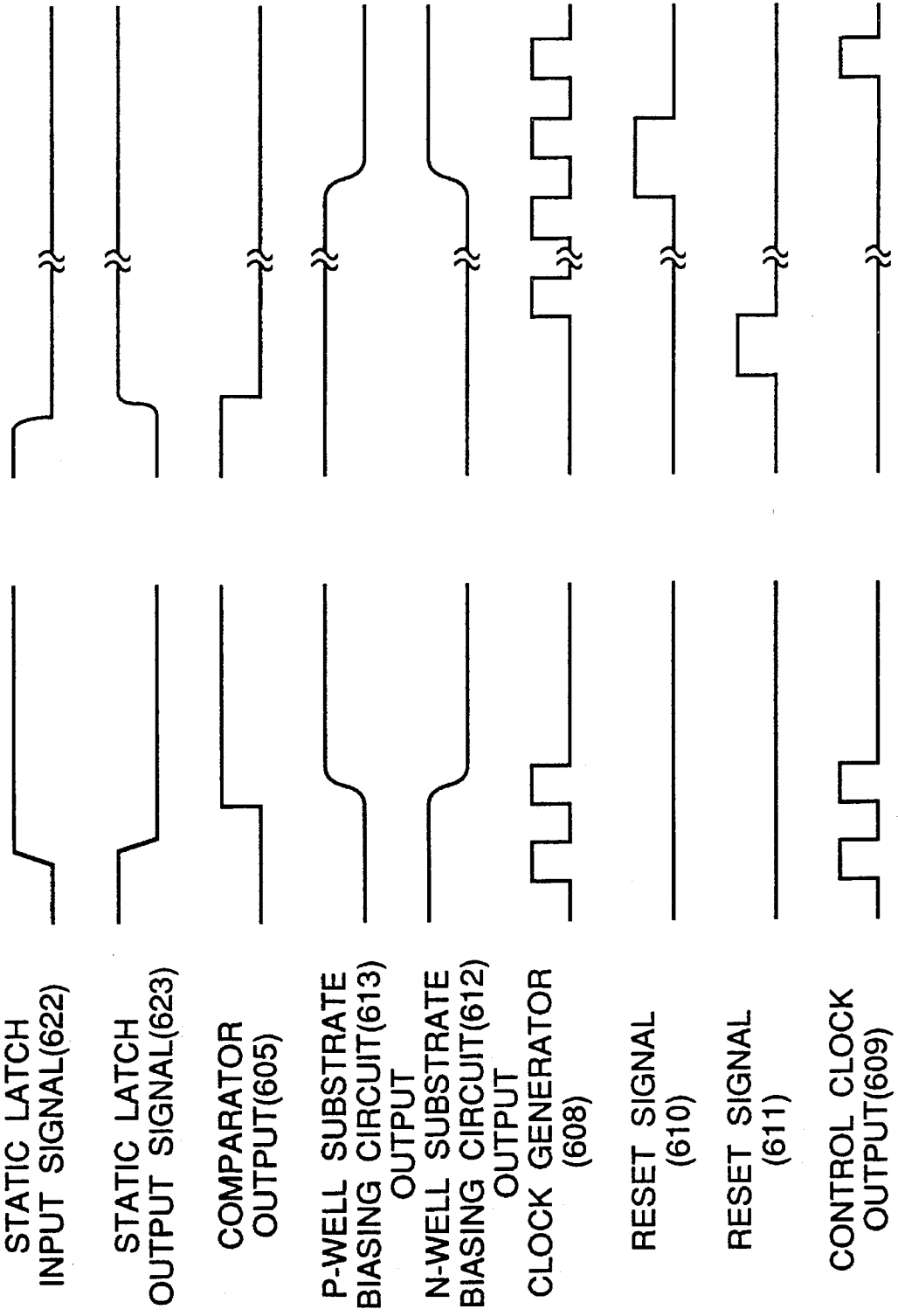
FIG. 8 is a timing chart illustrating an operation of the semiconductor integrated circuit device of the second embodiment shown in FIG. 6.

Referring to FIG. 8 illustrating various input and output waveforms and internal conditions in the second embodiment, in operation, noise caused by external disturbance appearing on the VDD line 600 or noise caused by all-bit simultaneous operation of input/output buffers or an abrupt supply voltage variation of 1 V or more, is filtered in the noise level detecting circuit 601 so that unnecessary high frequency components are eliminated, and the noise level (or noise strength) is discriminated.

When the noise level detecting circuit 601 outputs a high level signal 622 indicative of VDD noise or abrupt supply voltage variation, this is held in the static latch 621 until the output signal 622 of the noise level detecting circuit 601 is brought to a low level.

The output 623 of the static latch 621 is supplied to the comparator 604, when the shift register 632 stores the output 623 of the static latch 621, and the output 623 of the static latch 621 is compared with the output 623 of the static latch 621 before two clocks stored in the shift register 632 by the comparison circuit 633.

If the result of the comparison circuit 633 is inconsistency, and if the output 623 of the static latch 621 indicates the generation of the VDD noise or the abrupt supply voltage variation, the comparator 604 outputs the high level output signal 605, which is maintained until the content of the static latch 612 changes.

In response to a rising edge of the output signal 605 of the comparator 604, the substrate bias control circuit 606 causes the N-well substrate biasing circuit 612 and the P-well substrate biasing circuit 613 to stop application of their substrate bias voltage. Namely, the N-well substrate biasing circuit 612 stops application of the substrate bias voltage to the N-well in which the P-channel MOS transistor 614 is formed, and the P-well substrate biasing circuit 613 stops application of the substrate bias voltage to the P-well in which the N-channel MOS transistor 615 is formed. The stopping of the application of the substrate bias voltage to the N-well and the stopping of the application of the substrate bias voltage to th P-well can be performed in an arbitrary order or may be simultaneously performed. In any case, if a time from the stopping of the application of the substrate bias voltage until the threshold of the MOS transistors becomes stable at the built-in threshold does not exceed a half of one period of the system clock, no adverse effects occur.

Simultaneously to the substrate bias control circuit 606, in response to a rising edge of the comparator output signal 605, the clock generator 608 stops its controlling clock output 609 at a first falling of the controlling clock with the highest priority. Thereafter, the clock generator 608 stops oscillation of the internal clock oscillator. The internal clock oscillator in the clock generator 608 is formed of large-size transistors, and therefore may influence the level of the VDD line. The internal clock oscillator is stopped before the rising of the oscillation waveform, so that the internal condition is maintained at a standby condition.

As a result of the stop of the clock generation, the semiconductor integrated circuit of the second embodiment is put in the standby condition to avoid the malfunction which would otherwise be caused by the noise on the VDD line or the abrupt variation of 1 V or more on the VDD line.

Now, operation returning to the operating condition from the standby condition will be described.

Referring to FIGS. 6, 15 and 16 again, in response to the falling of the comparator output 605, a watch dog timer internally provided in the reset circuit 607 is reset to start its counting operation. The reset circuit 607 samples the comparator output 605 at four system clocks. If the reset circuit 607 detects that the comparator output 605 is brought to the low level as the extinction of the VDD noise or the depression of the abrupt supply voltage variation, the reset circuit 607 brings the reset signal 611 to the high level. The high level period of the reset signal 611 is controlled by the watch dog timer internally provided in the reset circuit 607 so as to correspond to one period of a system clock TCYK.

In response to the rising of the reset signal 611, the clock generator 608 causes the internal oscillator 751 to start its oscillation operation.

By further utilizing the watch dog timer internally provided in the reset circuit 607, the reset circuit 607 brings the reset signal 610 to a high level delayed from the reset signal 611 by twenty periods of the system clock TCYK. The high level period of the reset signal 610 corresponds to one period of the system clock TCYK.

In response to the rising edge of the reset signal 610, the substrate bias control circuit 606 causes the N-well substrate biasing circuit 612 and the P-well substrate biasing circuit 613 to restart the application of their substrate bias voltage. Namely, the N-well substrate biasing circuit 612 starts to apply the negative substrate bias in relation to the P-channel MOS transistor 614, and the P-well substrate biasing circuit 613 starts to apply the positive substrate bias in relation to the N-channel MOS transistor 615. Applications of the two substrate biases are simultaneously restarted in order to prevent the waveform distortion and timing deviation in relation to the clock generator 608 which has already restarted its oscillation operation of 100 MHz (which is the same as the frequency of the system clock). The substrate biases becomes stable within a half period of the system clock TCYK.

Furthermore, in response to the falling of the reset signal 610, the clock generator 608 starts to output the controlling clock 609 from the rising of the clock first outputted from the internal oscillator 751 in the clock generator 608. With this, the semiconductor integrated circuit device of the second embodiment is returned to the operating condition from the standby condition with no possibility of malfunction caused by the VDD noise or the abrupt supply voltage variation.

Therefore, the thresholds of N-channel MOS transistors and P-channel MOS transistors in the CMOS type semiconductor integrated circuit device during operation are controlled to desired reduced thresholds by the substrate biasing. As a result, the circuit operates at a high speed with a reduced threshold of the N-channel and P-channel MOS transistors. When an external or internal disturbance occurs on the VDD line or an abrupt supply voltage variation occurs in the CMOS type semiconductor integrated circuit device, the thresholds of N-channel MOS transistors and P-channel MOS transistors are returned to their respective built-in thresholds which are higher than the reduced thresholds desired for the high speed operation. At the same time, the circuit is put in the standby condition so as to hold the state of the circuit. Accordingly, there is obtained the standby condition having the VDD noise resistance property similar or superior to that of a semiconductor integrated circuit device form of well-known high-threshold MOS transistors widely used at present.

Also in this second embodiment, since a special voltage supply for holding the state of the circuit in the standby condition is not required, and since the substrate bias circuits do not consume and electric power in the standby condition, the power consumption in the standby condition can be reduced to 50% or less of that required in the conventional semiconductor integrated circuit device.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit device, comprising:

a least one MOS transistor having a variable threshold voltage;

a substrate biasing means for applying a predetermined substrate bias to said transistor during an operational period of said device;

a noise detecting means coupled to one of a ground line, a circuit external to said integrated circuit device, and a supply voltage line, for producing a noise detection signal upon detection of noise on said one of said ground line, said circuit external to said integrated circuit device, and said supply voltage line in excess of a predetermined noise level; and a control means, responsive to said noise detection signal to stop said substrate biasing means from applying said predetermined bias to said transistor;

wherein the presence of said noise detection signal substantially defines a standby period for said device, and the absence of said noise detection signal substantially defines said operational period of said device:

wherein said substrate biasing means substantially does not consume power during said standby period.

2. A semiconductor integrated circuit device as claimed in claim 1, wherein:

said MOS transistor is of an N-channel type, and said substrate biasing means applies a predetermined positive substrate bias to said N-channel MOS transistor during operation.

3. A semiconductor integrated circuit device as claimed in claim 1, wherein:

the semiconductor integrated circuit device is of a CMOS type including at least one N-channel MOS transistor formed in a P-well and at least one P-channel MOS transistor formed in a N-well, and said substrate biasing means applies a first predetermined voltage to said P-well so as to positively bias said P-well, and a second predetermined voltage to said N-well so as to negatively bias said N-well.

4. A semiconductor integrated circuit device comprising:

at least one MOS transistor disposed on a substrate, and having a variable threshold voltage;

a substrate biasing means for causing said substrate to be biased at one of a first predetermined bias and a second predetermined bias;

a noise detecting means coupled to one of a ground line, a circuit external to said integrated circuit device, and a supply voltage line, for producing a noise detection signal upon detection of noise in excess of a predetermined level on said one of said ground line, said circuit external to said integrated circuit device, and supply voltage line; and a control means for controlling said substrate biasing means to select one of said first and said second predetermined bias;

wherein said control means controls said substrate biasing means to cause said substrate to have said first predetermined bias in the presence of said noise detection signal, and to have said second predetermined bias in the absence of said noise detection signal, the is presence of said noise detection signal substantially defining a standby period of said device;

wherein said transistor assumes a first threshold voltage when said substrate has said first predetermined bias, and assumes a second threshold voltage when said substrate has said second predetermined bias;

wherein the magnitude of said first threshold voltage is greater than the magnitude of said second threshold voltage; and wherein said substrate biasing means substantially does not consume electric power during said standby period.

5. A semiconductor integrated circuit device according to claim 1, wherein:

said transistor has a relatively high built-in threshold voltage;

said substrate biasing means applies said predetermined bias to said transistor during operation so that said transistor has a threshold lower than said built-in threshold, whereby said transistor can operate at a high speed; and said control means restores said built-in threshold in response to said noise detection signal.

6. A semiconductor integrated circuit device having an operational mode and a standby mode, said device comprising:

a substrate;

a MOS transistor having a variable threshold voltage, including a first threshold voltage and a second threshold voltage, said transistor being disposed on said substrate, said first threshold voltage being greater in magnitude than said second threshold voltage;

a substrate biasing circuit biasing said substrate at one of a first predetermined bias and a second predetermined bias, said first predetermined bias causing said transistor to have said first threshold voltage, and said second predetermined bias causing said transistor to have said second threshold voltage, said first and said second threshold voltage being non-zero;

a clock generator for providing a control clock output signal to said device;

a comparator for providing a comparator output signal to said substrate biasing circuit and said clock generator; and a noise level detecting circuit coupled to one of a ground line, a circuit external to said integrated circuit device, and a supply voltage line, and providing a noise detection signal to said comparator upon detection of noise in excess of a predetermined level on said one of said ground line, said circuit external to said integrated circuit device, and said supply voltage line;

wherein said noise detection signal determines said standby mode of said device, and an absence of said noise detection signal determines said operational mode of said device;

wherein said comparator produces said comparator output signal in response to said noise detection signal;

wherein said clock generator is responsive to said comparator output signal to stop producing said control clock output signal; and wherein said substrate biasing circuit biases said substrate at said first predetermined bias in response to said comparator output signal, and biases said substrate at said second predetermined bias in the absence of said comparator output signal;

whereby when said device is in said standby mode, said transistor has said first threshold voltage, said substrate biasing circuit substantially does not consume electric power, and said clock generator does not produce said control clock output signal, and when said device is in said operational mode, said transistor has said second threshold voltage and said clock generator does produce said control clock output signal.

7. The device as set forth in claim 6, wherein said transistor is an N-channel MOS transistor, said first threshold voltage is 0.7 V, and said second threshold voltage is 0.4 V.

8. The device as set forth in claim 6, wherein said transistor is a P-channel MOS transistor, said first threshold voltage is −0.7 V, and said second threshold voltage is −0.4 V.

9. A semiconductor integrated circuit device with an operational period and a standby period, comprising:

a noise detector coupled to one of a ground line, a circuit external to said integrated circuit device, and a supply voltage line, for producing a noise detection signal upon detection of noise on said one of said ground line, said circuit external to said integrated circuit device, and said supply voltage line in excess of a predetermined noise level;

a control circuit, responsive to said noise detection signal, for determining said operational period and said standby period;

transistors, including an N-channel MOS transistor disposed in a P-well of a substrate, and a P-channel MOS transistor disposed in an N-well of said substrate; and a biasing circuit coupled with said N-well and said P-well;

wherein each of said transistors has a respective first threshold voltage and a respective second threshold voltage, said respective first threshold voltage of said N-channel MOS transistor being greater than said respective second threshold voltage thereof, and said respective first threshold voltage of said P-channel MOS transistor being less than said respective second threshold voltage thereof, said first and said second threshold voltage each being non-zero;

wherein, during said operational period, said biasing circuit biases said N-well and said P-well by expending electric power so that said N-channel and said P-channel MOS transistors have said respective second threshold voltage;

wherein, during said standby period, said biasing circuit substantially does not expend electric power to bias said N-well and said P-well thereby causing said N-channel and said P-channel MOS transistors to have said respective first threshold voltage.

10. The device as set forth in claim 9, wherein:

said first threshold voltage of said N-channel MOS transistor is 0.7 V, and said second threshold voltage thereof is 0.4 V; and said first threshold voltage of said P-channel MOS transistor is −0.7 V, and said second threshold voltage thereof is −0.4 V.

* * * * *